(12) United States Patent
Johnson

(10) Patent No.: US 6,177,980 B1
(45) Date of Patent: Jan. 23, 2001

(54) HIGH-THROUGHPUT, MASKLESS LITHOGRAPHY SYSTEM

(76) Inventor: Kenneth C. Johnson, 2502 Robertson Rd., Santa Clara, CA (US) 95051

(*) Notice: Under 35 U.S.C. 154(b), the term of this patent shall be extended for 0 days.

(21) Appl. No.: 09/286,888

(22) Filed: Apr. 9, 1999

Related U.S. Application Data

(63) Continuation-in-part of application No. 08/803,096, filed on Feb. 20, 1997, now Pat. No. 6,133,986.
(60) Provisional application No. 60/081,731, filed on Apr. 14, 1998.

(51) Int. Cl.[7] .......................... G03B 27/54; G03B 27/00; G03H 1/08; G02B 26/00; G01D 9/00
(52) U.S. Cl. .................... 355/67; 355/1; 355/44; 359/9; 359/291; 359/572; 346/66
(58) Field of Search .................. 355/67, 30, 35, 355/74, 113, 44, 40, 41, 52; 352/198; 362/3; 359/291, 197, 210

(56) References Cited

U.S. PATENT DOCUMENTS

| | | | |
|---|---|---|---|
| H1525 | * 4/1996 | Geil et al. | 355/44 |
| 2,830,866 | * 4/1958 | Warner | 346/66 |
| 5,170,269 | * 12/1992 | Lin et al. | 359/9 |
| 5,450,157 | * 9/1995 | Rees | 355/1 |
| 5,661,540 | * 8/1997 | Kaihotsu et al. | 355/1 |
| 5,661,592 | * 8/1997 | Bornstein et al. | 359/291 |
| 5,841,579 | * 11/1998 | Bloom et al. | 359/572 |

* cited by examiner

Primary Examiner—Russell Adams
Assistant Examiner—R Bindingnavele
(74) Attorney, Agent, or Firm—Townsend and Townsend and Crew LLP

(57) ABSTRACT

A microscopy and/or lithography system uses a comparatively low-resolution image projection system, which has a very small numerical aperture but large image field, in conjunction with a microlens array comprising miniature lens elements, each of which has a large numerical aperture but very small field. The projection system contains a small aperture stop which is imaged by the microlenses onto an array of diffraction-limited microspots on the microscope sample or printing surface at the microlens focal point positions, and the surface is scanned to build up a complete raster image from the focal point array. The system design thus circumvents the tradeoff between image resolution and field size which is the source of much of the complexity and expense of conventional wide-field, high-NA microscopy and microlithography systems. The system makes possible flat field, distortion-free imaging, with accurate overlay, focus, and warp compensation, over very large image fields (larger than the practical limits of conventional imaging means). The image source may be a spatial light modulator such as a Grating Light Valve.

1 Claim, 6 Drawing Sheets

HIGH-THROUGHPUT, MASKLESS LITHOGRAPHY SYSTEM

CROSS-REFERENCE TO RELATED APPLICATIONS

This application claims priority from provisional application 60/081,731 (filed Apr. 14, 1998), expired which is a C-I-P of application Ser. No. 08/803,096 (filed Feb. 20, 1997), now U.S. Pat. No. 6,133,986 the disclosures of which are incorporated by reference.

BACKGROUND OF THE INVENTION

The invention relates generally to what can be broadly categorized as "image writing." The invention's primary intended application for image writing would be as a microlithography printer for semiconductor manufacture; however this field may also include applications such as document printing, photographic reproduction, etc.

The following references are hereby incorporated by reference in their entirety for all purposes:

Ref. 1: "Microlens Scanner for Microlithography and Wide-Field Confocal Microscopy" (U.S. patent application Ser. No. 08/803,096; PCT Serial No. PCT/US97/02949; filed Feb. 20, 1997)

Ref. 2: "Method of Making and an Apparatus for a Flat Diffraction Grating Light Valve" (U.S. Pat. No. 5,661,592, issued Aug. 26, 1997)

Ref. 3: "Flat Diffraction Grating Light Valve" (U.S. Pat. No. 5,841,579, issued Nov. 24, 1998)

Ref. 1 proposed the use of a Digital Micromirror Device (DMD, manufactured by Texas Instruments) as a spatial light modulator for a maskless lithography system. The DMD is manufactured in a megapixel ($10^6$ pixel) configuration and has a mechanical switching time of 20 microseconds; hence the maximum achievable data rate would be $50 \cdot 10^9$ bits per sec per DMD unit (i.e. 50 KHz per pixel times $10^6$ pixels). Compared to commercial laser writing systems this is a very high rate, but for wafer production applications much higher throughput would be required. Assuming a minimum feature resolution of 0.1 µm, a typical 200-mm wafer can have on the order of $3 \cdot 10^{12}$ resolvable feature elements. The wafer design would require a grid snap significantly smaller than the minimum resolvable spot size; hence the number of image data bits per 200-mm wafer would typically exceed $3 \cdot 10^{13}$. Commercial lithography steppers achieve throughput levels on the order of 100 wafers per hour, so a competitive maskless lithography system would need to write at least $100 \cdot 3 \cdot 10^{13}$ image bits per hour, which translates to a data rate of about 1 THz (i.e. $10^{12}$ bits per sec).

One method proposed in Ref. 1 to boost throughput would be to operate several DMD units in parallel, but to achieve a 1 THz pixel rate this would require about 20 megapixel DMD units, each with its own associated optics, servo control, and image generation electronics. A more practical and economical approach to improving throughput would be to use a faster spatial light modulator.

SUMMARY OF THE INVENTION

The invention provides imaging systems and techniques that circumvent the tradeoff between image resolution and field size which is the source of much of the complexity and expense of conventional wide-field, high-NA microlithography systems.

In short, this is achieved by using a comparatively low-resolution image projection system in conjunction with a microlens array comprising miniature lens elements. The projection system contains a small aperture stop which is imaged by the microlenses onto an array of diffraction-limited microspots on the printing surface at the microlens focal point positions, and the surface is scanned to build up a complete raster image from the focal point array. An image source includes an array of light-modulating image source elements.

In specific embodiments, the image projection system has a very small numerical aperture but large image field, while each microlens has a large numerical aperture but very small field.

High throughput can be achieved by using a spatial light modulator similar to the Grating Light Valve (GLV, manufactured by Silicon Light Machines in Sunnyvale, Calif.; Ref's. 2, 3). Like the DMD, the GLV is a microelectromechanical system that modulates image pixels by means of mechanically actuated microscopic mirror elements. But rather than tilting the mirrors, the GLV imparts a slight translational motion to the mirrors in order to induce a phase shift in portions of the reflected beam. It functions essentially as a dynamically variable diffraction grating, rapidly modulating the amount of light that is directed into the zero diffracted order. The GLV's switching time is just 20 nanoseconds; hence a megapixel GLV unit could achieve a data rate well in excess of 1 THz.

DESCRIPTION OF SPECIFIC EMBODIMENTS

Figure 1:
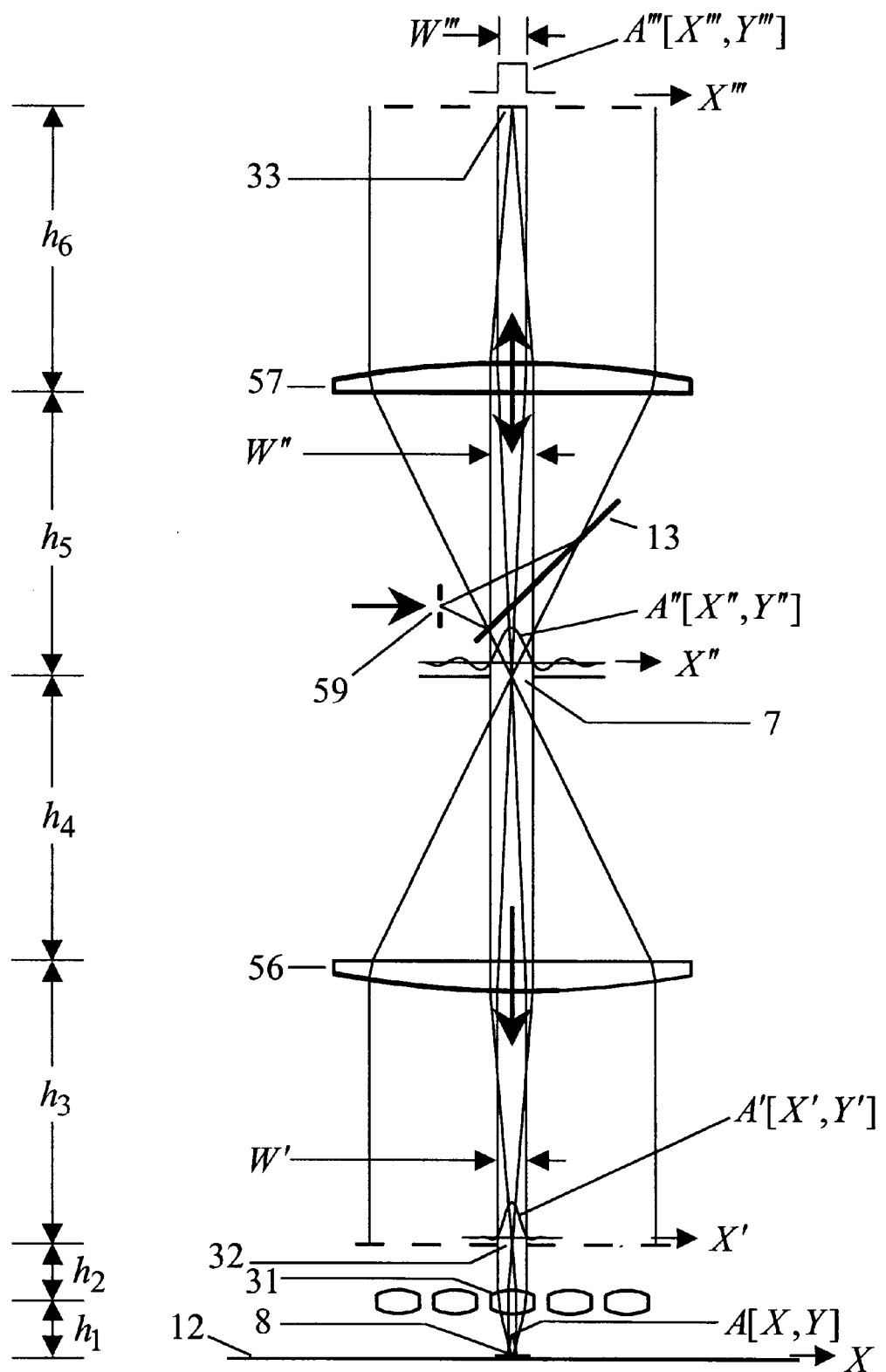
FIG. 1 illustrates the optical layout of a lithography printer that could employ a GLV-type device.

FIG. 1 illustrates the optical layout of a lithography printer that could employ a GLV-type device. (FIG. 1 is similar to FIGS. 2, 18 and 14 in Ref. 1. The figure is only a conceptual schematic; a more practical design configuration will be discussed below.) Illumination is brought into the system through an illumination aperture 59 and is redirected along the system's optical axis by a beam splitter 13. The illumination is collimated by lens 57 and retroreflects off of an array of light-modulating pixel elements (e.g. element 33). The pixel array could be a GLV device. The retroreflected beam is focused by lens 57 onto projection aperture 7, and is recollimated by lens 56. The two collimating lenses 56 and 57 image individual pixel elements onto corresponding microlens apertures (e.g. pixel 33 is imaged onto aperture 32). Corresponding microlenses collect the light from the microlens apertures and focus the light onto an array of microspots on a photoresist-coated wafer 12 (e.g. microlens 31 collects light from aperture 32 and focuses it onto at microspot at point 8). The microspots are conjugate to the projection aperture 7. The light intensity at each microspot is controlled by a corresponding pixel element (e.g. pixel 33 controls the intensity at point 8). The wafer is scanned under the beam as the pixels modulate the microspot intensities, resulting in a raster-scanned, high-resolution latent image being recorded in the photoresist.

The spacings between the elements in FIG. 1 are defined as follows: The spacing $h_1$ between the wafer and microlens array, and the spacing $h_2$ between the microlenses and corresponding microlens apertures, would both preferably be equal to the microlens focal length $F_m$, $$h_1 = h_2 = F_m \qquad \text{Eq 1}$$

(Actually, the spacing $h_2$ is not critical because the beam is highly collimated in the space between the microlenses and microlens apertures, and in practice the apertures might be formed right on the microlenses. But it will be convenient to assume Eq 1 for the present analysis, because the electric field distributions on the microlens apertures and at the wafer are then related by a simple Fourier transform relationship.) The spacing $h_3$ between the microlens aperture array and collimating lens 56, and the spacing $h_4$ between lens 56 and the projection aperture 7, are both equal to the focal length $F_c$ of lens 56, $$h_3 = h_4 = F_c \qquad \text{Eq 2}$$

Similarly, the spacing $h_5$ between aperture 7 and collimating lens 57, and the spacing $h_6$ between lens 57 and the pixel array, are both equal to the focal length $F'_c$ of lens 57, $$h_5 = h_6 = F'_c \qquad \text{Eq 3}$$

Figure 2:
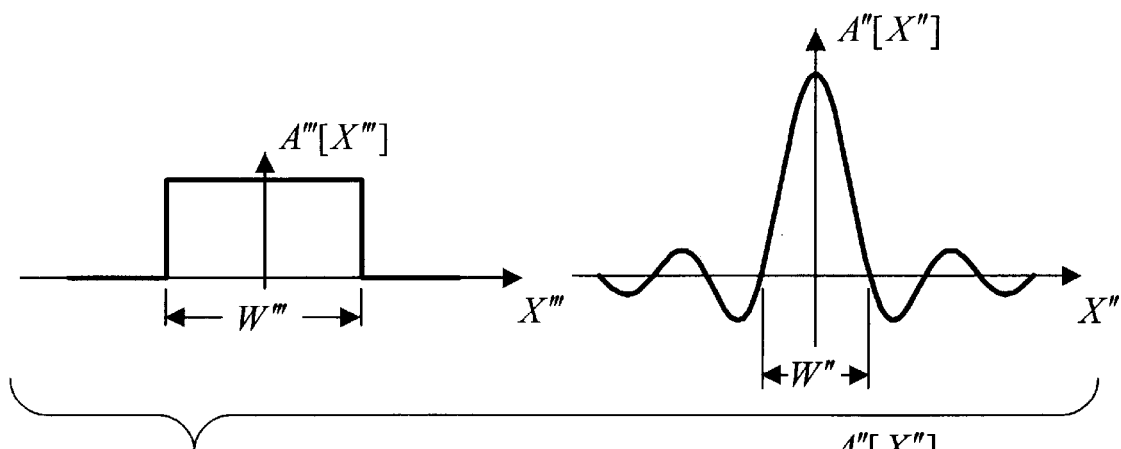
FIG. 2 illustrates the electric field distribution A'''[X'''] reflected by a pixel in its "on" state and the corresponding field amplitude A''[X''] at the printer system's projection aperture.

(This arrangement eliminates the need for the aperture lens illustrated as element 58 of FIG. 2 in Ref. 1, although a zero-power aperture lens could still optionally be included for aberration control.)

The (scalar) electric field amplitude distributions on the wafer plane, on the microlens aperture plane, on the projection aperture plane, and the pixel object plane, will be denoted $A[X,Y]$, $A'[X',Y']$, $A''[X'',Y'']$, and $A'''[X''',Y''']$, respectively, where $\{X,Y\}$, etc. are position coordinates on the respective planes. These functions will represent the field distributions originating from a particular pixel element (e.g. pixel 33), and the total field will be a superposition of such fields from different pixels. The amplitude transmittance functions of the corresponding microlens aperture and the projection aperture will be denoted as $t'[X',Y']$ and $t''[X'',Y'']$, respectively. Based on the above positional relationships (Eq's 1–3), the field distributions are related by the following Fourier transform relationships, $$A''[X'', Y''] = \frac{1}{\lambda F'_c} \int\int A'''[X''', Y''']\exp\left[i2\pi\frac{X''X''' + Y''Y'''}{\lambda F'_c}\right]dX'''dY''' \qquad \text{Eq 4}$$

$$A'[X', Y'] = \frac{1}{\lambda F_c} \int\int t''[X'', Y'']A''[X'', Y'']\exp\left[i2\pi\frac{X'X'' + Y'Y''}{\lambda F_c}\right]dX''dY'' \qquad \text{Eq 5}$$

$$A[X, Y] = \frac{1}{\lambda F_m} \int\int t'[X', Y']A'[X', Y']\exp\left[i2\pi\frac{XX' + YY'}{\lambda F_m}\right]dX'dY' \qquad \text{Eq 6}$$

(This assumes a time scale factor of $\exp[+i\omega t]$; and an unimportant constant scale factor is neglected in each of these equations.) For simplicity we will consider the case where all of the functions in the above equations are separable in the X and Y coordinates (e.g., $A[X,Y]=A[X]A[Y]$, $t'[X',Y']=t'[X']t'[Y']$, etc.), in which case the above Fourier transform relationships apply separately to the X and Y coordinates. We will focus on the X components of these relationships:

$$A''[X''] = \frac{1}{\sqrt{\lambda F'_c}} \int A'''[X''']\exp\left[i2\pi\frac{X''X'''}{\lambda F'_c}\right]dX''' \qquad \text{Eq 7}$$

$$A'[X'] = \frac{1}{\sqrt{\lambda F_c}} \int t''[X'']A''[X'']\exp\left[i2\pi\frac{X'X''}{\lambda F_c}\right]dX'' \qquad \text{Eq 8}$$

$$A[X] = \frac{1}{\sqrt{\lambda F_m}} \int t'[X']A'[X']\exp\left[i2\pi\frac{XX'}{\lambda F_m}\right]dX' \qquad \text{Eq 9}$$

When a pixel is in its "on" state, the field amplitude $A'''[X''']$ reflected from the pixel is defined by $$A'''[X'''] = \begin{cases} 1, & |X'''| < W'''/2 \\ 0, & |X'''| > W'''/2 \end{cases} \text{(on state)} \qquad \text{Eq 10}$$

where $W'''$ is the pixel width in the direction of the $X'''$ coordinate (FIG. 1) and the origin of the $X'''$ axis is assumed (for simplicity) to be at the pixel center. Based on Eq 7, the field distribution $A''[X'']$ at the projection aperture is $$A''[X''] = \frac{\sqrt{\lambda F'_c}}{\pi X''}\sin\left[\frac{\pi W''' X''}{\lambda F'_c}\right] \text{(on state)} \qquad \text{Eq 11}$$

This distribution is illustrated in FIG. 2. The projection aperture's transmittance function $t''[X'']$ will be defined as $$t''[X''] = \begin{cases} 1, & |X''| < W''/2 \\ 0, & |X''| > W''/2 \end{cases} \qquad \text{Eq 12}$$

where $W''$ is the aperture width in the $X''$ direction (FIG. 1). The aperture is not apodized, but it can be "effectively apodized" by taking advantage of the natural tapered profile of the $A''$ distribution, which resembles an apodized profile.

A good design approach would be to select the aperture width W" so that the aperture edges are at the first nodes of the field amplitude profile (FIG. 2), $$W'' = \frac{2\lambda F'_c}{W'''} \quad \text{Eq 13}$$

This dimension is small enough to provide good spatial filtering at the projection aperture, but large enough to provide acceptable imaging resolution in the projection optics and good optical efficiency. The aperture's geometric collection efficiency (i.e. the percentage of pixel-reflected light collected by the aperture in a pixel's on state) is 90%. (Actually the 90% figure only represents the efficiency defined by the aperture's X" limits. If the aperture is similarly limited in the Y" direction its collection efficiency would be 81%).

Figure 3:
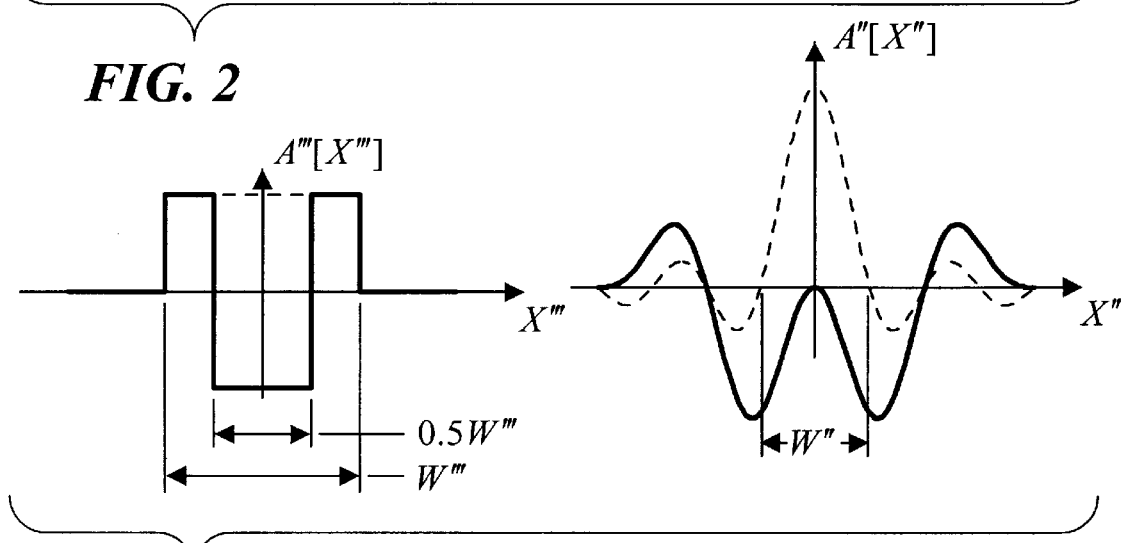
FIG. 3 illustrates the A'' distribution resulting from an A''' distribution that has been phase-shifted by $\pi$ over the central 50% of the pixel area.
Figure 4:
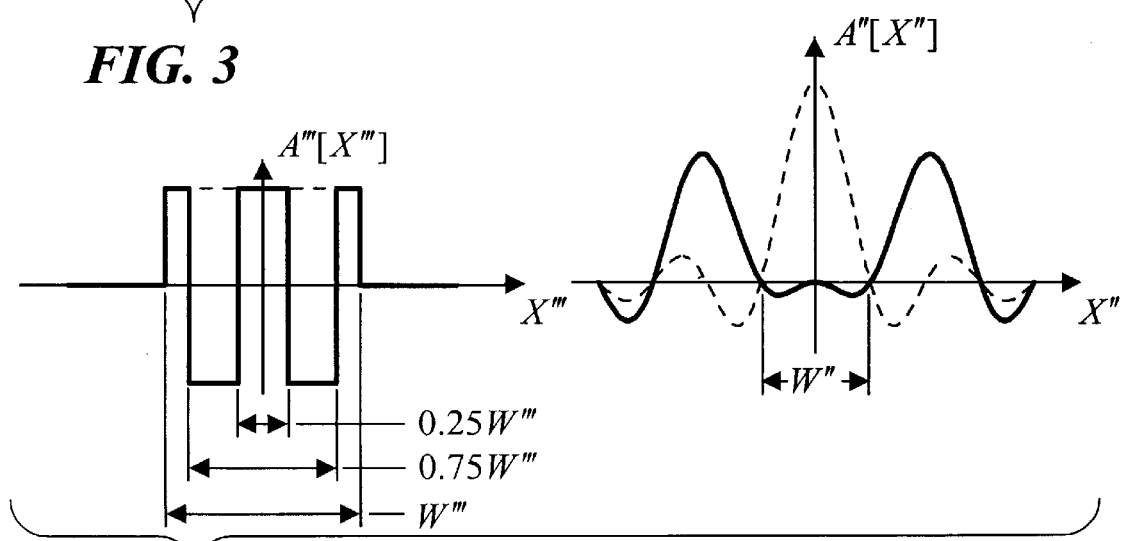
FIG. 4 illustrates how much better extinction can be achieved by phase-shifting two zones on the pixel aperture.

In its "off" state a GLV pixel deflects the reflected light outside of the collection aperture. This is achieved by phase-shifting a portion of the reflected beam. If the beam is phase-shifted by $\pi$ on one-half of the pixel aperture area the amplitude distribution on the projection aperture will be zero at the aperture center point. Furthermore, if the pixel's phase distribution has even symmetry, then the amplitude distribution will also have zero slope at the center point. For example, FIG. 3 illustrates the A" distribution resulting from an A'" distribution that has been phase-shifted by $\pi$ over the central 50% of the pixel area. (The A'" distributions shown in FIG. 3 and other following figures are all symmetric, i.e. A'"[X'"]=A'"[−X'"]). This phase profile results in an extinction factor (i.e. ratio of the collection efficiency in the off state to that in the on state) of 28%. Much better extinction can be achieved by phase-shifting two zones, as illustrated in FIG. 4. The A" distribution shown in FIG. 4 is zero at the aperture edges as well as at the center point, and the extinction factor is 3.8%. This illustrates the GLV's basic principle of operation (Ref's. 2, 3). Each pixel element in a GLV comprises several parallel reflective ribbons, with alternate ribbons having electrostatic actuators that can induce a quarter-wave displacement in the ribbon position, thereby inducing a phase shift of $\pi$ in the portion of the beam reflected by the actuated ribbons. (GLV display systems are normally designed to collect the diffracted light and exclude the zero-order reflected light. This approach could be used in the lithography system, however the preferred mode described above does just the opposite: It collects the zero-order light and excludes the diffracted light. Thus, in this context, a GLV pixel is optically "off" when its displacement tranducers are electrostatically activated.)

Figure 5:
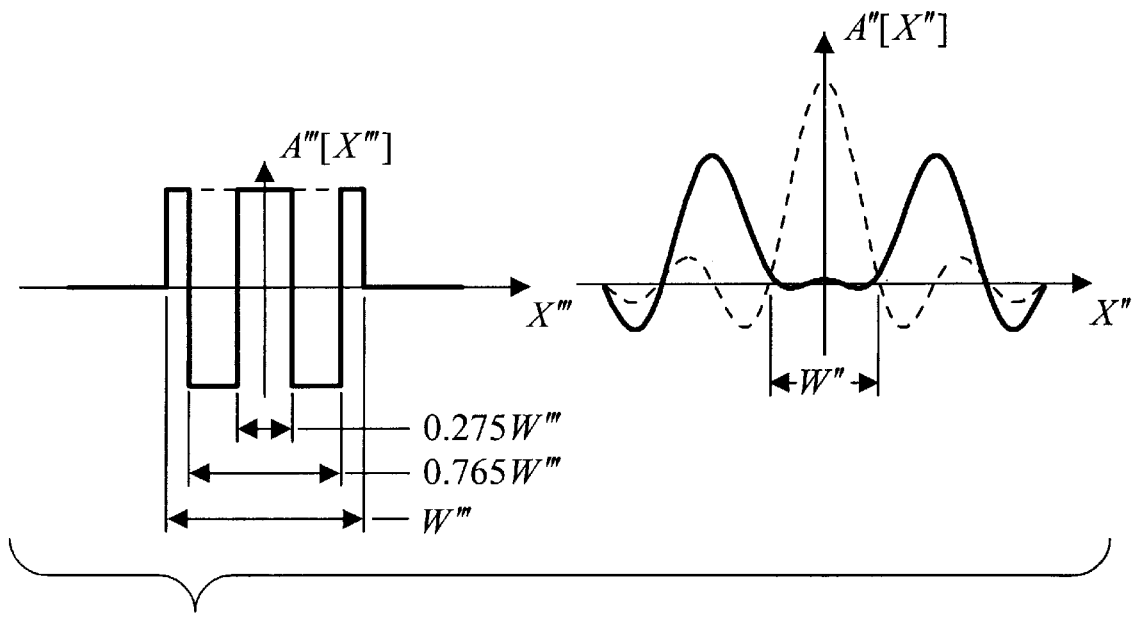
FIG. 5 illustrates a two-actuator pixel design that achieves a 0.075% extinction factor.
Figure 6:
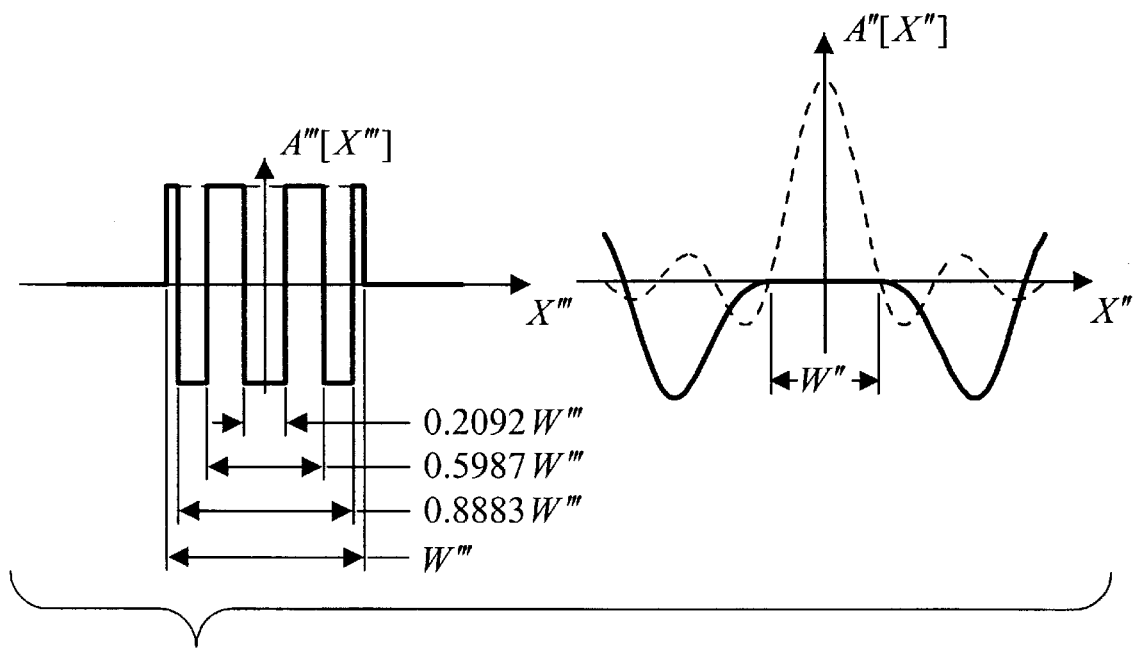
FIG. 6 shows an optimized three-actuator design that has a theoretical extinction factor of just 0.00004%.

The GLV's extinction factor can be improved by optimizing the ribbon widths to minimize collection efficiency in the off state. FIG. 5 illustrates a two-actuator design that achieves a 0.075% extinction factor, and FIG. 6 shows an optimized three-actuator design that has a theoretical extinction factor of just 0.00004%. (The three-actuator design has the practical advantage that the A" distribution is flat at the aperture edges, making it tolerant of slight misalignment errors.)

The above-quoted extinction factors assume that the phase shift is exactly $\pi$ (i.e. the actuated ribbon reflectors are displaced by exactly a quarter wave). The extinction factor has a sinusoidal dependence on the phase shift $\delta$; e.g. if the extinction factor at $\delta=\pi$ is essentially zero (as it is with the three-actuator design of FIG. 6), then the functional dependence of the extinction factor $\eta_{ext}$ on $\delta$ is $$\eta_{ext}[\delta]=\tfrac{1}{2}(1+\cos[\delta]) \quad \text{Eq 14}$$

To achieve an extinction factor not exceeding 1%, for example, the phase shift would need to be controlled to a tolerance of ±8° (or about 0.01 wave displacement tolerance). A more detailed tolerance analysis would also take into account the surface flatness and tilt of the GLV reflectors.

Some practical refinements of the above design approach are possible. In practice there would, of course, need to be spaces of non-zero width between the GLV reflectors. Also, the pixels could have fixed diffracting or absorbing features formed on their surfaces in order to tailor their reflectance efficiencies to counterbalance nonuniformities in the illumination or in the system transmittance efficiency.

Figure 7:
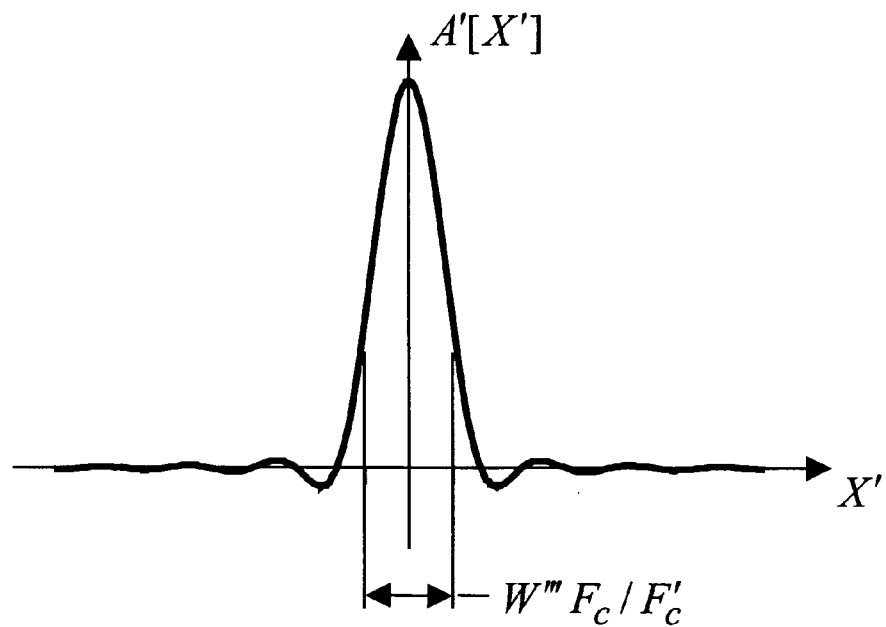
FIG. 7 illustrates the field distribution A'[X'] at the microlens aperture plane with a pixel in its on state.

The field distribution A'[X'] at the microlens aperture plane with a pixel in its on state can be determined by substituting Eq's 11–13 in Eq 8. This distribution is illustrated in FIG. 7. The geometric image of the pixel aperture, which has width W'"$F_c$/$F'_c$, encloses 96% of the energy in the A' distribution. (The 96% figure only considers energy enclosed by the geometric image's limits in the X' direction. If the geometric image is similarly limited in the Y' direction the enclosed energy fraction would actually be 92%.)

Figure 8:
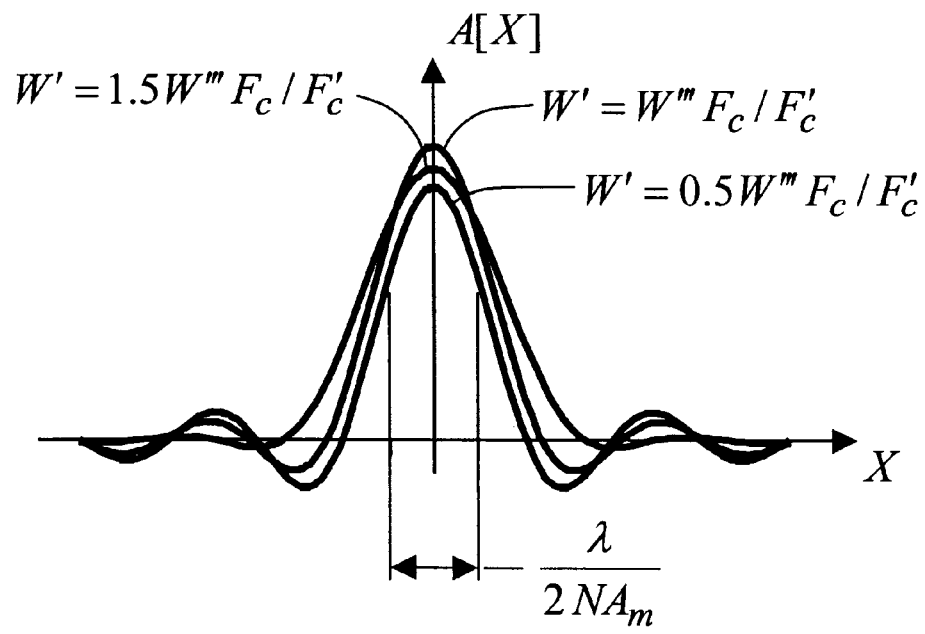
FIG. 8 illustrates wafer-plane field distributions A[X] for three different values of the microlens aperture width W'.

The microlens aperture's transmittance function is defined by $$t'[X'] = \begin{cases} 1, & |X'| < W'/2 \\ 0, & |X'| > W'/2 \end{cases} \quad \text{Eq 15}$$

where W' is the aperture width (FIG. 1). The aperture width would be selected to balance a couple of design tradeoffs: A small, overfilled aperture would provide high imaging resolution at the microlens aperture plane and minimal sensitivity to any slight positional error of the microlens aperture relative to the pixel image. But a larger, underfilled aperture would provide better energy throughput, and would also provide better sideband suppression in the wafer-plane field distribution, A[X]. (The sideband suppression would tend to result in straighter, more uniform line features and lesser proximity effects in the printed image.) FIG. 8 illustrates A[X] distributions for three different W' values. Note that the distribution with the highest peak corresponds to a microlens aperture dimension that matches the pixel aperture's geometric image size. However, this distribution has significant sidebands, which can be significantly reduced by slightly underfilling the microlens aperture (e.g. by setting W'=1.5W'"$F_c$/$F'_c$).

Figure 9:
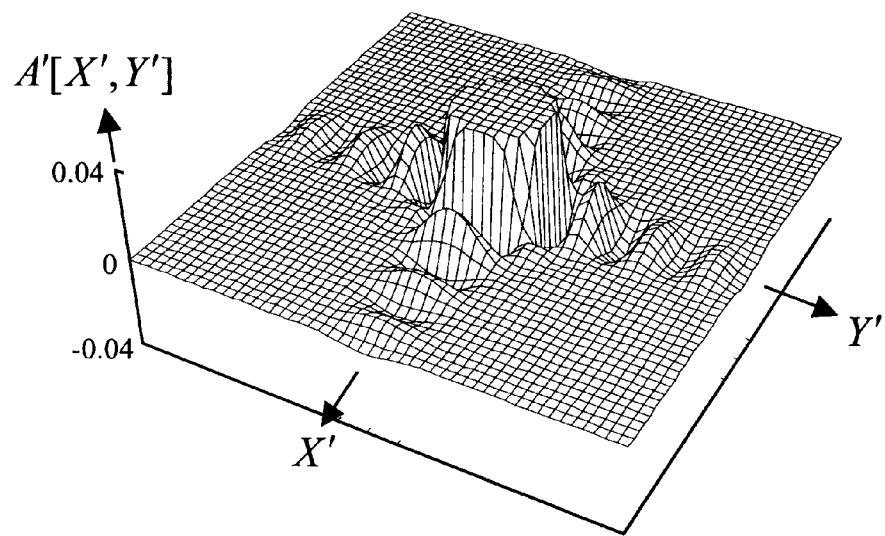
FIG. 9 shows the diffraction amplitude sidebands at the microlens aperture plane due to square pixel and projection apertures.
Figure 10:
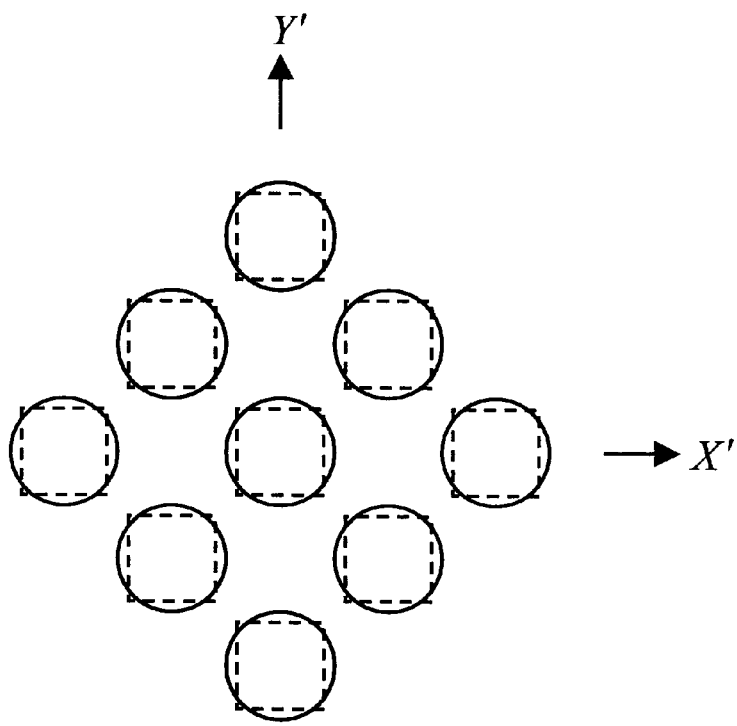
FIG. 10 illustrates microlens apertures that are diagonally offset relative to the orientation of the pixel and projection apertures.

FIGS. 2, 7, and 8 represent the field distribution's cross-section in the plane Y=0 with the pixel in its on state, assuming rectangular apertures aligned to the X, Y axes. (If the apertures are square the cross-section in the plane X=0 will be identical). In practice it may be better to use circular apertures, at least for the microlens apertures, since rectangular apertures tend to concentrate the diffracted light in two long, narrow bands parallel to the X and Y axes. However, the GLV pixel apertures would normally be square, and it may also be advantageous to use a square projection aperture because the diffraction banding effect can be taken advantage of to actually reduce light leakage into adjacent microlenses. This effect is illustrated in FIG. 9, which shows the diffraction amplitude sidebands at the microlens aperture plane due to square pixel and projection apertures. (FIG. 7 represents the cross-section of this distribution in the plane Y'=0. The vertical scale in FIG. 9 is normalized to the peak amplitude, and for clarity of illustration the peak is truncated in FIG. 9.) If the microlenses are diagonally offset relative to the aperture orientation, as illustrated in FIG. 10, the diffraction tails will be confined primarily to the spaces between the microlens apertures. (The circles in FIG. 10 represent circular microlens apertures, and the squares represent the geometric images of the GLV pixel apertures on the microlens aperture plane.)

Figure 11:
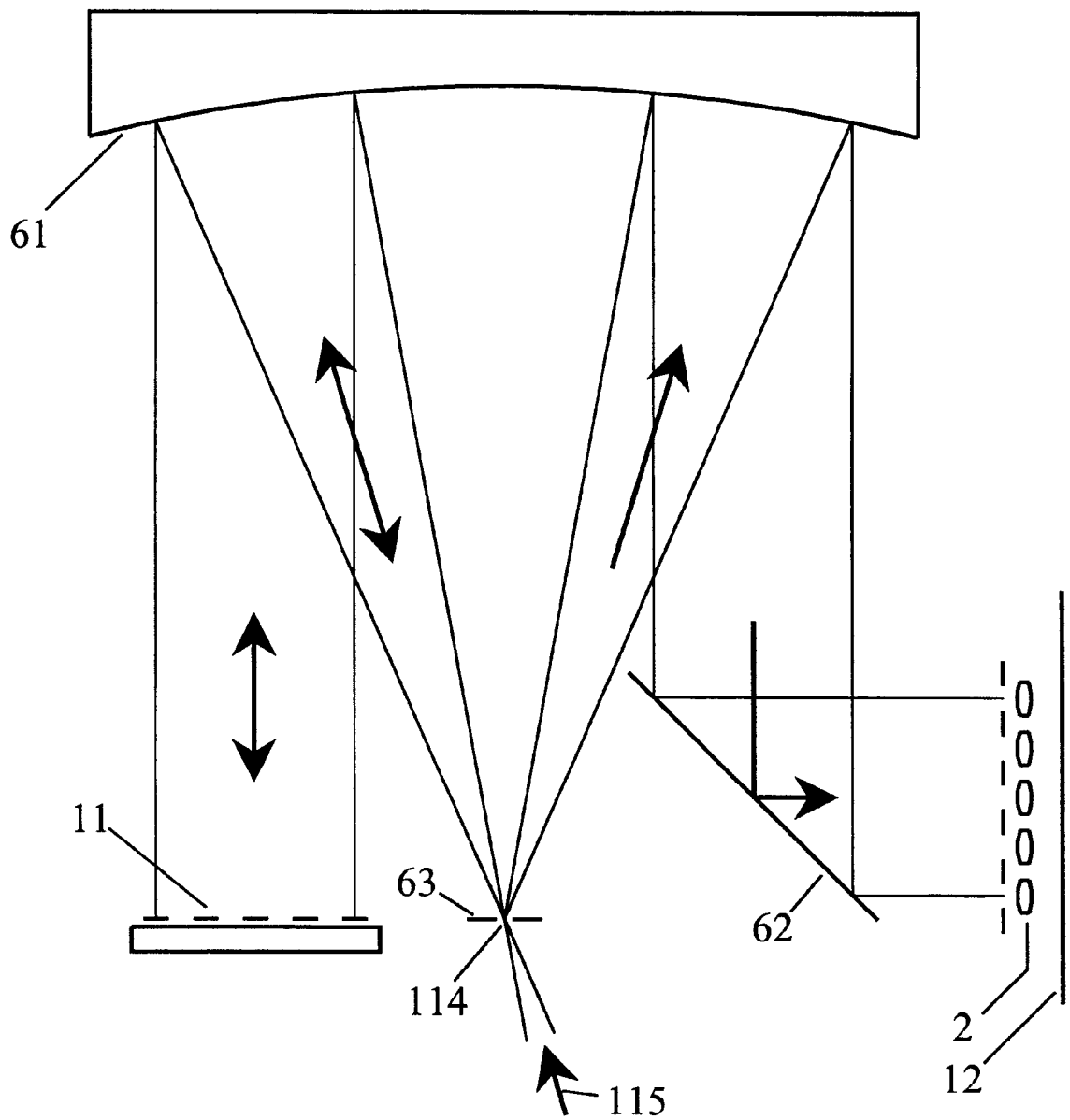
FIG. 11 illustrates an optical system layout that is more practical than that shown in FIG. 1.

FIG. 20 in Ref. 1 illustrates an optical system layout that is more practical than that described above and shown in FIG. 1. (The image source 11 in Ref. 1, FIG. 20 could be a GLV unit). A slight variant of this configuration is shown in FIG. 11. The projection aperture (element 7 in FIG. 1) comprises a small mirror 63. A much smaller subaperture 114 in the mirror admits a focused laser beam 115. (Alternatively, a fiber optic source could feed into the light path through aperture 114). The beam is collimated by a collimating mirror 61 (which serves the function of both collimating elements 56 and 57 in FIG. 1), retroreflects off of the GLV pixel array 11, and is focused back onto the projection aperture. It then reflects off of mirror 63, is again collimated by mirror 61, is reflected by folding mirror 62, and is focused by the microlens array 2 onto the wafer 12. The subaperture 114 obstructs part of the projection aperture, but it would typically be a couple orders of magnitude smaller than a pixel's diffraction point spread function on the projection aperture (i.e. the A" distribution). Hence it would have little effect on the wafer-plane field distribution.

What is claimed is:

1. A printing system comprising:

an optical projection system having an object plane, an image plane which is conjugate to the object plane, and a limiting aperture stop which is referred to as the projection aperture;

a planar array of microlenses having respective apertures defining a microlens aperture array, wherein the aperture array is positioned at the projection system's image plane, and wherein the microlenses have respective focal points which are conjugate to the projection aperture and which define a focal point array;

a scanning mechanism which establishes relative motion between the microlens array and a printing surface proximate the focal point array, wherein the paths traversed by the focal points relative to the printing surface comprise a set of closely-spaced raster lines;

an image source comprising an array of light-modulating image source elements, each image source element comprising a grating light valve pixel, wherein the image source is positioned at the projection system's object plane, and wherein the projection system images each image source element onto a corresponding microlens aperture and the image source element thus controls the light level over a microspot on the printing surface, proximate the corresponding microlens focal point; and an image modulation mechanism that controls the image source as the printing surface is scanned, whereby, when a photosensitive material is positioned in the printing surface, a synthesized, high-resolution raster image is recorded on the photosensitive material.

* * * * *